(12) United States Patent
Boling

(10) Patent No.: US 9,710,006 B2
(45) Date of Patent: Jul. 18, 2017

(54) POWER UP BODY BIAS CIRCUITS AND METHODS

(71) Applicant: MIE Fujitsu Semiconductor Limited, Kuwana (JP)

(72) Inventor: Edward J. Boling, Fremont, CA (US)

(73) Assignee: Mie Fujitsu Semiconductor Limited, Kuwana (JP)

( * ) Notice: Subject to any disclaimer, the term of this patent is extended or adjusted under 35 U.S.C. 154(b) by 31 days.

(21) Appl. No.: 14/341,733

(22) Filed: Jul. 25, 2014

(65) Prior Publication Data

US 2016/0026207 A1 Jan. 28, 2016

(51) Int. Cl.
*H03K 3/01* (2006.01)
*G05F 3/20* (2006.01)

(52) U.S. Cl.
CPC .................................. *G05F 3/205* (2013.01)

(58) Field of Classification Search
CPC ....... H03K 2217/0018; H03K 19/0016; H03K 19/00384; G05F 3/205; G11C 5/146
USPC ......................................................... 327/534
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 4,982,113 A * | 1/1991 | Jinbo .............................. 326/80 |
| 5,034,337 A | 7/1991 | Mosher et al. |

(Continued)

FOREIGN PATENT DOCUMENTS

| | | |
|---|---|---|
| EP | 0274278 A1 | 7/1988 |
| EP | 0312237 A2 | 4/1989 |

(Continued)

OTHER PUBLICATIONS

Bibliographic information and English Translation of Abstract for KR1020050099328 submitted herewith.

(Continued)

*Primary Examiner* — Quan Tra
(74) *Attorney, Agent, or Firm* — Baker Botts L.L.P.

(57) ABSTRACT

An integrated circuit device can include at least a first body bias circuit configured to generate a first body bias voltage different from power supply voltages of the IC device; at least a first bias control circuit configured to set a first body bias node to a first power supply voltage, and subsequently enabling the first body bias node to be set to the first body bias voltage; and a plurality of first transistors having bodies connected to the first body bias node.

19 Claims, 10 Drawing Sheets

(56) References Cited

U.S. PATENT DOCUMENTS

| | | | |
|---|---|---|---|
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |
| 5,371,419 A * | 12/1994 | Sundby | 327/543 |
| 5,373,186 A | 12/1994 | Schubert et al. | |
| 5,384,476 A | 1/1995 | Nishizawa et al. | |
| 5,426,328 A | 6/1995 | Yilmaz et al. | |
| 5,444,008 A | 8/1995 | Han et al. | |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,854,561 A * | 12/1998 | Arimoto et al. | 327/534 |
| 5,856,003 A | 1/1999 | Chiu | |
| 5,861,334 A | 1/1999 | Rho | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasamura et al. | |
| 5,899,714 A | 5/1999 | Farremkopf et al. | |
| 5,918,129 A | 6/1999 | Fulford, Jr. et al. | |
| 5,923,067 A | 7/1999 | Voldman | |
| 5,923,987 A | 7/1999 | Burr | |
| 5,933,047 A * | 8/1999 | Zhu | G11C 5/145 327/534 |
| 5,936,868 A | 8/1999 | Hall | |
| 5,942,932 A * | 8/1999 | Shen | 327/530 |
| 5,946,214 A | 8/1999 | Heavlin | |
| 5,985,705 A | 11/1999 | Seliskar | |
| 5,989,963 A | 11/1999 | Luning et al. | |
| 5,991,221 A * | 11/1999 | Ishikawa | G11C 5/14 365/189.06 |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,103,562 A | 8/2000 | Son et al. | |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,252,452 B1 * | 6/2001 | Hatori | H03K 3/0315 327/544 |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,019 B1 | 4/2002 | Yu et al. | |
| 6,391,752 B1 | 5/2002 | Colinge et al. | |
| 6,426,260 B1 | 7/2002 | Hshieh | |
| 6,426,279 B1 | 7/2002 | Huster et al. | |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata | |
| 6,461,928 B2 | 10/2002 | Rodder | |
| 6,472,278 B1 | 10/2002 | Marshall et al. | |
| 6,473,282 B1 * | 10/2002 | Lin | H01L 27/0251 327/543 |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 | 1/2003 | Ishida et al. | |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara et al. | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |

(56) References Cited

U.S. PATENT DOCUMENTS

| | | | |
|---|---|---|---|
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,247,896 B2 | 7/2007 | Oh et al. |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,510,932 B2 | 3/2009 | Oh et al. |
| 7,514,766 B2 | 4/2009 | Yoshida |
| 7,521,323 B2 | 4/2009 | Surdeanu et al. |
| 7,521,988 B2* | 4/2009 | Shin .......................... 327/536 |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,639,041 B1* | 12/2009 | Perisetty ............ H03K 19/0016 |
| | | 326/38 |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawae et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |

US 9,710,006 B2
Page 4

(56) References Cited

U.S. PATENT DOCUMENTS

| | | |
|---|---|---|
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,164,378 B2 * | 4/2012 | Pietri .................... G05F 3/205 327/407 |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0033511 A1 | 3/2002 | Babcock et al. |
| 2002/0042184 A1 | 4/2002 | Nandakumar et al. |
| 2002/0089370 A1 * | 7/2002 | Shin .................... G05F 1/465 327/536 |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0053457 A1 | 3/2004 | Sohn |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0056877 A1 | 3/2005 | Rueckes et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. |
| 2006/0154428 A1 | 7/2006 | Dokumaci |
| 2006/0157794 A1 | 7/2006 | Doyle et al. |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0004107 A1 | 1/2007 | Lee et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0001171 A1 | 1/2008 | Tezuka et al. |
| 2008/0067589 A1 | 3/2008 | Ito et al. |
| 2008/0108208 A1 | 5/2008 | Arevalo et al. |
| 2008/0138953 A1 | 6/2008 | Challa et al. |
| 2008/0143423 A1 * | 6/2008 | Komatsu et al. ............. 327/534 |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0057746 A1 | 3/2009 | Sugll et al. |
| 2009/0057762 A1 | 3/2009 | Bangsaruntip et al. |
| 2009/0108350 A1 | 4/2009 | Cai et al. |

(56) References Cited

U.S. PATENT DOCUMENTS

| | | | |
|---|---|---|---|
| 2009/0121298 A1 | 5/2009 | Furukawa et al. | |
| 2009/0134468 A1 | 5/2009 | Tsuchiya et al. | |
| 2009/0224319 A1 | 9/2009 | Kohli | |
| 2009/0302388 A1 | 12/2009 | Cai et al. | |
| 2009/0309140 A1 | 12/2009 | Khamankar et al. | |
| 2009/0311837 A1 | 12/2009 | Kapoor | |
| 2009/0321849 A1 | 12/2009 | Miyamura et al. | |
| 2010/0012988 A1 | 1/2010 | Yang et al. | |
| 2010/0038724 A1 | 2/2010 | Anderson et al. | |
| 2010/0055886 A1 | 3/2010 | Izumida et al. | |
| 2010/0100856 A1 | 4/2010 | Mittal | |
| 2010/0148153 A1 | 6/2010 | Hudait et al. | |
| 2010/0149854 A1 | 6/2010 | Vora | |
| 2010/0187641 A1 | 7/2010 | Zhu et al. | |
| 2010/0207182 A1 | 8/2010 | Paschal | |
| 2010/0270600 A1 | 10/2010 | Inukai et al. | |
| 2011/0059588 A1 | 3/2011 | Kang | |
| 2011/0073961 A1 | 3/2011 | Dennard et al. | |
| 2011/0074498 A1* | 3/2011 | Thompson et al. | 327/543 |
| 2011/0079860 A1 | 4/2011 | Verhulst | |
| 2011/0079861 A1 | 4/2011 | Shifren et al. | |
| 2011/0095811 A1 | 4/2011 | Chi et al. | |
| 2011/0147828 A1 | 6/2011 | Murthy et al. | |
| 2011/0148945 A1* | 6/2011 | Matsuda | H03M 1/76 345/690 |
| 2011/0169082 A1 | 7/2011 | Zhu et al. | |
| 2011/0175170 A1 | 7/2011 | Wang et al. | |
| 2011/0180880 A1 | 7/2011 | Chudzik et al. | |
| 2011/0193164 A1 | 8/2011 | Zhu | |
| 2011/0212590 A1 | 9/2011 | Wu et al. | |
| 2011/0230039 A1 | 9/2011 | Mowry et al. | |
| 2011/0242921 A1 | 10/2011 | Tran et al. | |
| 2011/0248352 A1 | 10/2011 | Shifren et al. | |
| 2011/0294278 A1 | 12/2011 | Eguchi et al. | |
| 2011/0309447 A1* | 12/2011 | Arghavani et al. | 257/368 |
| 2012/0021594 A1 | 1/2012 | Gurtej et al. | |
| 2012/0034745 A1 | 2/2012 | Colombeau et al. | |
| 2012/0056275 A1 | 3/2012 | Cai et al. | |
| 2012/0065920 A1 | 3/2012 | Nagumo et al. | |
| 2012/0108050 A1 | 5/2012 | Chen et al. | |
| 2012/0132998 A1 | 5/2012 | Kwon et al. | |
| 2012/0138953 A1 | 6/2012 | Cai et al. | |
| 2012/0146155 A1 | 6/2012 | Hoentschel et al. | |
| 2012/0167025 A1 | 6/2012 | Gillespie et al. | |
| 2012/0187491 A1 | 7/2012 | Zhu et al. | |
| 2012/0190177 A1 | 7/2012 | Kim et al. | |
| 2012/0223363 A1 | 9/2012 | Kronholz et al. | |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| KR | 1020050099328 B1 | 10/2005 |
| WO | 2011062788 A1 | 5/2011 |

OTHER PUBLICATIONS

English Translation of JP 8153873 Submitted herewith.

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, 1995, pp. 23-24.

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content $Si_{1-y}C_y$ Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

Noda, K et al., "A 0.1- μm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18- μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999,Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3' 1998, pp. 1-19.

Wann, C. et al., "Channel Profile Optimization and Device Design for Low-Power High-Performance Dynamic-Threshold MOSFET", 1996, IEDM 96, pp. 113-116.

Werner, P et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7.

Dreslinkski, Ronald G. et al., "Near-Threshold Computing: Reclaiming Moore's Law Through Energy Efficient Integrated Circuits", Feb. 2010, Proceedings of the IEEE, vol. 98, Issue 2, IEEE.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, Vo. 87, No. 4, pp. 537-570.

Machine Translation of KR 10-0794094 Submitted herewith.

Banerjee et al., "Compensating Non-Optical Effects using Electrically-Driven Optical Proximity Correction", Proc. of SPIE, vol. 7275, 2009.

(56) References Cited

OTHER PUBLICATIONS

Cheng et al., "Extremely Thin SOI (ETSOI) CMOS with Record Low Variability for Low Power System-on-Chip Applications", IEDM 2009, Dec. 2009.
Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.
Drennan et al., "Implications of Proximity Effects for Analog Design", Custom Integrated Circuits Conference, 2006, CICC '06, IEEE, Sep. 10-13, 2006, pp. 169-176.
Hook et al., "Lateral Ion Implant Straggle and Mask Proximity Effect", IEEE Transactions on Electron Devices, vol. 50, No. 9, Sep. 2003.
Hori et al., "A 0.1 um CMOS with a Step Channel Profile Formed by Ultra High Vacuum CVD and In-Situ Doped Ions", IEDM 1993, May 12, 1993.
Matsuhashi et al., "High-Performance Double-Layer Epitaxial-Channel PMOSFET Compatible with a Single Gate CMOSFET", 1996 Symposium on VLSI Technology Digest of Technical Papers, 1996.
Shao et al., "Boron diffusion in silicon: the anomalies and control by point defect engineering", Materials Science and Engineering R 42 (2003), Nov. 2003, pp. 65-114.
Sheu et al., "Modeling the Well-Edge Proximity Effect in Highly Scaled MOSFETs", IEEE Transactions on Electron Devices, vol. 53, No. 11, Nov. 2006, pp. 2792-2798.

\* cited by examiner

US 9,710,006 B2

1

POWER UP BODY BIAS CIRCUITS AND METHODS

TECHNICAL FIELD

The present invention relates generally to transistor body biasing circuits for integrated circuit devices, and more particularly to body biasing circuits for establishing body bias voltages upon power-up of such devices.

BACKGROUND

Integrated circuit (IC) devices can include transistors, such as insulated gate field effect transistors (hereinafter referred to as MOS type transistors, but not implying any particular gate or gate insulator material). MOS type transistors can include gates, drains, sources and bodies. In some IC devices, or some circuits within an IC device, the bodies of transistors have a permanent connection to a power supply voltage. For example, bodies of p-channel MOS transistors are connected to a high power supply voltage (e.g., VDD), while bodies of n-channel transistors are connected to a low power supply voltage (e.g., VSS).

However, in other IC devices or circuits within an IC device, the bodies of transistors can be biased to potential different from a power supply voltage. Such body biasing can advantageously alter the performance of the transistors. For example, a greater reverse body bias (i.e., p-channels body biased to a voltage above VDD or n-channel body biased to a voltage less than VSS) can decrease a transistor current leakage. Greater forward body bias (i.e., p-channels body biased to a voltage below VDD or n-channel body biased to a voltage above VSS) can increase transistor switching speed. In some cases, an IC device can include one or more body bias voltage generating circuits to generate desired body bias voltages, which are then applied to the bodies of target transistors.

A drawback to implementing body biasing circuits can be the need to strictly control body voltages during the transient state of powering up the IC device. If body voltages levels are not strictly controlled, a p-n junction formed by a transistor body can forward bias, drawing a large amount of current, and possibly damaging the IC device. Further, the initial floating states of transistor bodies can give rise to latch-up conditions (activation of a parasitic bipolar junction transistor).

DETAILED DESCRIPTION

Figure 1:
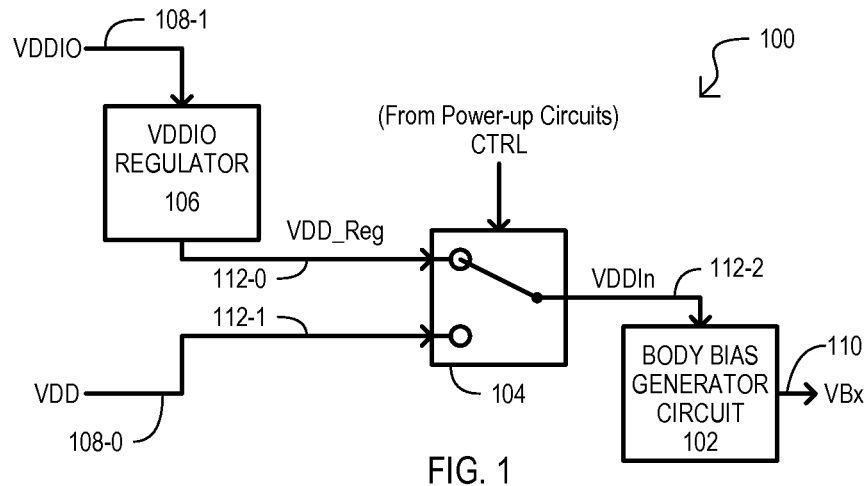
FIG. 1 is a block schematic diagram of a body bias circuit according to an embodiment.

Various embodiments of the present invention will now be described with reference to a number of drawings. The embodiments show circuits, integrated circuit (IC) devices, and methods for controlling body bias voltages during a power-up operation that can reduce current spikes and/or latch-up. Power-up operations can include those operations when a power supply voltage initially ramps up, including when a device is initially powered on, reset, subject to a power interruption event, or dynamically powered on and off for power conservation purposes, as but a few examples.

In the embodiments below, like items are referred to by the same reference character but with the leading digit(s) corresponding to the figure number.

Figure 12A:
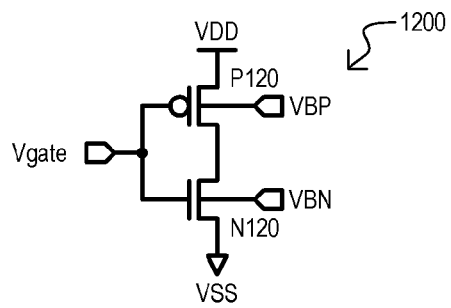
FIG. 12A is a representation of a circuit having body biasing according to an embodiment.

FIG. 12A is a schematic representation of body biased complementary MOS transistors in an IC device. An IC device 1200 can include a p-channel transistor P120 having a source connected to a high power supply voltage (VDD) and a body that receives a p-channel body bias voltage (VBP). Similarly, an n-channel transistor N120 can have a source connected to a low power supply voltage (VSS) and a body that receives an n-channel body bias voltage (VBN). FIG. 12A also shows a transistor gate voltage Vgate (shown applied to both transistors P120 and N120, by way of example only).

Figure 12B:
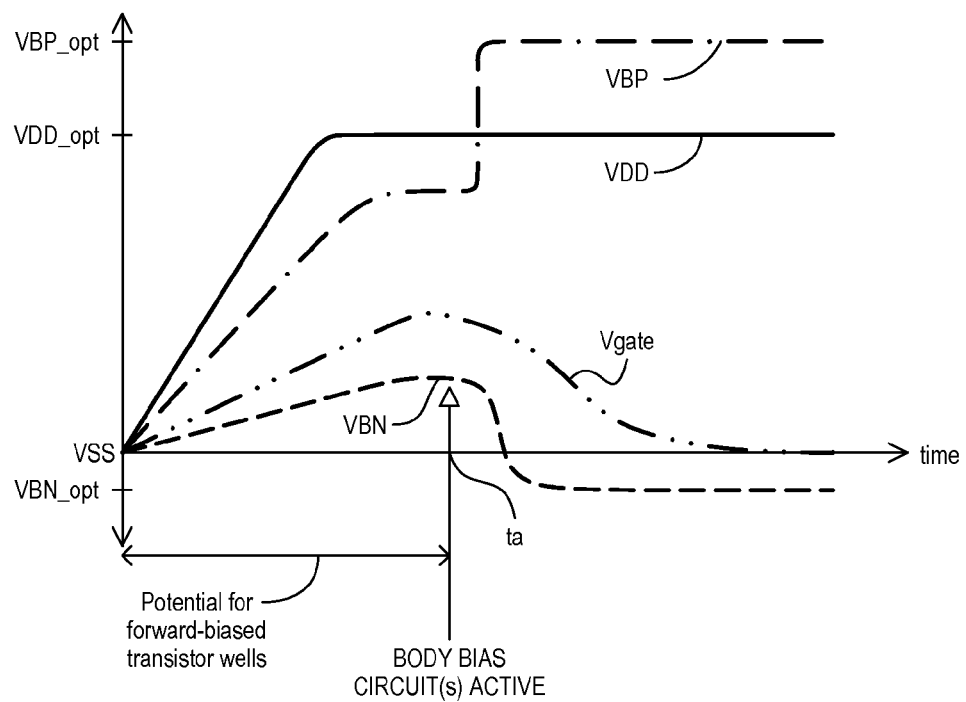
FIG. 12B is a timing diagram showing a power up operation for an IC device like that represented in FIG. 12A.

FIG. 12B is a timing diagram showing a power-up operation for an IC device like that represented in FIG. 12A. FIG. 12B shows VDD, VBP, VBN and Vgate, noted above in FIG. 12A. During a power-up operation, VDD ramps from VSS (0 volts in this example) to a desired level (VDD_opt). However, during this time period body bias circuits are not active. Consequently, a body voltage of the transistors (VBP and VBN) can float. Accordingly, due to resistive and/or capacitive coupling, such body bias voltages may vary. In the event VBN rises above VSS by a sufficient amount or VBP is below VDD by a sufficient amount, p-n junctions formed by the transistor bodies can be forward biased, drawing large amounts of current. Such floating bodies can also lead to latch-up conditions.

Referring still to FIG. 12B, once VDD reaches stable level, body bias circuits can be activated. This is shown at time ta, where VBP is driven to VBP_opt and VBN is driven to VBN_opt.

Figure 13A:
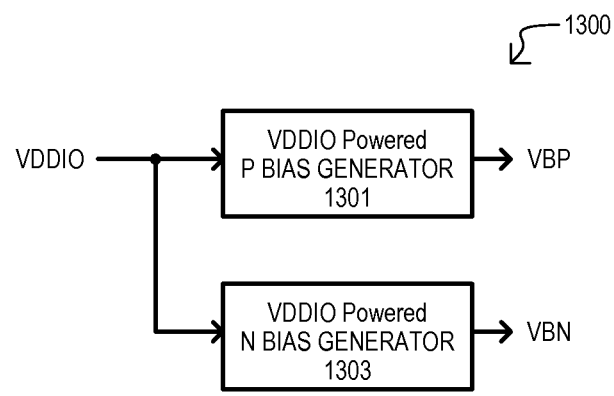
FIG. 13A is a block schematic diagram of a conventional body biasing arrangement.
Figure 13B:
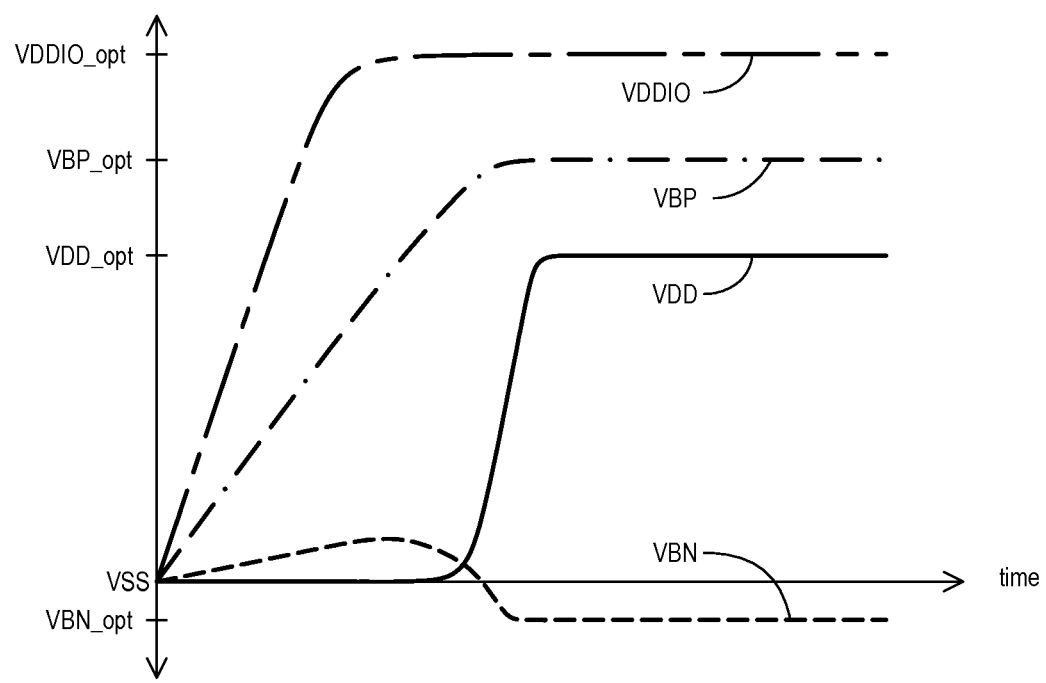
FIG. 13B is a timing diagram showing a power up operation for device like that of FIG. 13B.

FIGS. 13A and 13B show one conventional way of addressing body (i.e., well) biasing during power-up operations. In the conventional approach of FIGS. 13A and 13B it is assumed that the IC device has an input/output power supply voltage (VDDIO) that is greater than VDD. Further, VDDIO is powered up first, prior to VDD. FIG. 13A shows a conventional body biasing arrangement having body bias circuits powered by VDDIO. In particular, a p-channel body bias generating circuit 1301 can generate VBP from VDDIO, and an n-channel body bias generating circuit 1303 can generate VBN from VDDIO.

As shown in FIG. 13B, body bias circuits 1301/1302 can establish body bias voltages VBP/VBN prior to VDD ramping-up. This can substantially reduce current draw on power-up, and prevent and/or greatly reduce the chance of latch-up.

It is noted that the efficiency of such a body bias approach can be limited to:

$$EFF = \left|\frac{Vout}{VDDIO}\right|$$

where Vout is VBP or VBN. For example, assuming VBN=−0.6V and VDDIO=2.5 V, efficiency would be no greater than 24%.

FIG. 1 is a block schematic diagram of a body bias circuit 100 according to a first embodiment. It is assumed that a body bias circuit 100 is included in an integrated circuit device having a first high power supply voltage (VDD), as well as a second high power supply voltage (VDDIO). In some embodiments, a second power supply voltage can be greater than the first high power supply voltage (i.e., VDDIO>VDD). In some embodiments, VDDIO can be greater than 1.5 volts, such as 1.8 volts as but one example, or greater than 2.0 volts, around 2.5 volts, or even higher, such as around 3.3. volts. In some embodiments, VDD can be less than 2.5 volts, or less than 2.0 volts, or less than 1.5 volts. In one very particular embodiment, VDDIO can be about 2.5 volts and VDD can be about 1.2 volts. In a power-up operation, the VDDIO supply ramps up first. A body bias voltage can be initially generated based on the VDDIO supply. Once a body bias voltage is at a desirable level, the other power supply voltage VDD can ramp up. In particular embodiments, VDDIO can be an input/output power supply voltage that provides power to input/output drivers of the IC device.

In the embodiment shown, a body bias circuit 100 can receive a first power supply voltage (VDD) at a first power supply input 108-0, a second power supply voltage (VDDIO) at a second power supply input 108-1, and can generate a body bias voltage (VBx) at a body bias node 110. A body bias circuit 100 can include a body bias generator circuit 102, a switch circuit 104, and a voltage regulator 106. A voltage regulator 106 can receive VDDIO, and regulate it to achieve a predetermined level VDD_Reg (which can be the desired final level for VDD).

Switch circuit 104 can include a first switch input 112-0, second switch input 112-1, and switch output 112-2. First switch input 112-0 can receive the voltage VDD_Reg, generated from VDDIO. Second switch input 112-1 can receive voltage VDD. Switch circuit 104 can be controlled by a control signal CTRL generated by power-up circuits (not shown). On power up, CTRL can have a first value that results in first switch input 112-0 being connected to switch output 112-2, and second switch input 112-1 being isolated from switch output 112-2. CTRL can then change to a second value that results in first switch input 112-0 being isolated from switch output 112-2, and second switch input 112-1 being connected to switch output 112-2. In some embodiments, control signal CTRL can be based on VDD power-on reset (POR) type circuit, or the like.

Body bias generator circuit 102 can receive a power supply voltage VDDIn from the switch output 112-2. In response to VDDIn, body bias generator circuit 102 can generate a body bias voltage VBx. It is understood that VBx can be an n-channel body bias voltage or a p-channel body bias voltage.

Referring still to FIG. 1, in operation, it is assumed the VDDIO ramps up before VDD. Further, signal CTRL switches from the first to second value after VDD has reached a stable level. Accordingly, in a power up operation, VDDIO ramps first, resulting in voltage regulator 106 providing VDD_Reg to switch circuit 104. CTRL has the first value, so VDD_Reg is provided as VDDIn to the body bias generator circuit 102. The body bias generator circuit 102 generates body bias voltage VBx, thus establishing a desired body bias for transistors. Subsequently, with transistor body bias(es) established, VDD can ramp up, avoiding conditions that could forward bias p-n junctions and/or lead to latch-up, as body bias generator circuit 102 is driving such bodies to desired voltages. Once VDD has reached a desired level and/or stability, signal CTRL can switch to the second value, applying VDD as VDDIn to the body bias generator circuit 102. Because VDD<VDDIO, the generation of the body bias voltage can be more efficient.

It is understood that an IC device can include multiple body bias circuits like that shown in FIG. 1, to generate various body bias voltages, including both positive and negative body bias voltages. Further, a generated body bias voltage can be a reverse body bias (i.e., greater than VDD for p-channel devices, or less than VSS for n-channel devices), or a forward body bias (i.e., less than VDD for p-channel devices, or greater than VSS for n-channel devices, but short of a voltage that forward biases the body p-n junction). In very particular embodiments, a reverse body bias voltage for p-channel devices (VBP) can range from about one volt greater than VDD to about 0.1 volt greater than VDD. Similarly, a reverse body bias voltage for n-channel transistors (VBN) can range from about one volt less than VSS to about 0.1 volt less than VSS. A forward VBP limit can depend on doping conditions, but in particular embodiments can be no more than 0.6 less than VDD. Likewise, a forward VBN limit can depend on doping conditions, but in particular embodiments can be no more than 0.6 greater than VSS.

While embodiments can include arrangements that switch a power supply voltage to body bias generator circuits, other embodiments can maintain (e.g., clamp) transistor bodies at a "safe" voltage upon power up. Subsequently, once body bias voltages are established, the transistor bodies can be switched from the clamped voltage to a desired body bias voltage. Examples of such embodiments will now be described.

Figure 2A:
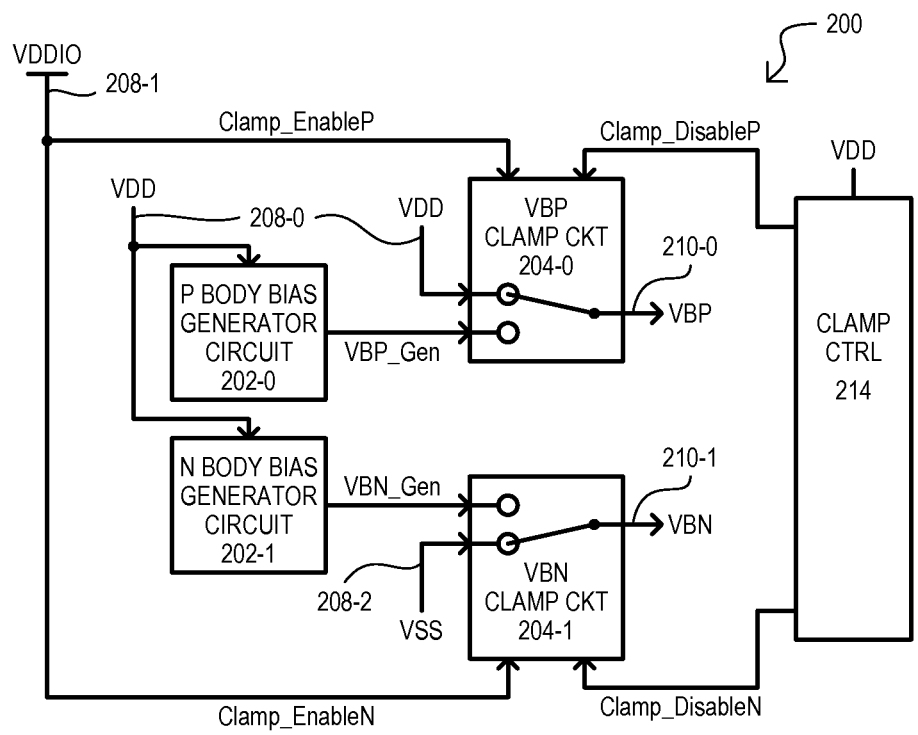
FIG. 2A is a block schematic diagram of a body bias circuit according to another embodiment.

FIG. 2A is a block schematic diagram of a body bias circuit 200 according to another embodiment. As in the case of FIG. 1, in FIG. 2A it is assumed that body bias circuit 200 is included in an IC device having a higher second power supply voltage (VDDIO) that ramps up prior to a first power supply voltage VDD. The particular values and relationships between VDD and VDDIO can include those described above, and equivalents.

In the embodiment shown, a body bias circuit 200 can utilize the first ramping power supply voltage (e.g., VDDIO) to enable clamping circuits to clamp body bias nodes to the other power supply voltages (e.g., VDD, VSS). Thus, as the device powers up, transistors bodies are clamped to such power supply voltages (e.g., VDD, VSS). Once the lower power supply voltage (VDD) is stable, body bias generator circuits can generate body bias voltages. The body bias nodes can then be "unclamped" from the power supply voltages and connected to the body bias voltages.

In the particular embodiment shown, a body bias circuit 200 can include a p-channel transistor body bias (PBB) generator circuit 202-0, an n-channel transistor body bias (NBB) generator circuit 202-1, a first clamp circuit 204-0, a second clamp circuit 204-1, and a clamp control circuit 214. PBB generator circuit 202-0 can generate a body bias voltage VBP_Gen for p-channel transistors. Similarly, NBB generator circuit 202-1 can generate a body bias voltage VBN_Gen for n-channel transistors. Both PBB and NBB generator circuits (202-0/1) can be powered with a first power supply voltage (VDD), which is understood to ramp up after a second power supply voltage (VDDIO). Thus, in an initial part of a power up operation, prior to VDD ramping up, PBB and NBB generator circuits (202-0/1) are not active, and thus are not generating their respective body bias voltages VBP_Gen, VBN_Gen.

Power supply voltage VDD can be provided from high power supply input 208-0 as a first input to first clamp circuit 204-0. First clamp circuit 204-0 can receive VBP_Gen from PBB generator circuit 202-0 as a second input. Output 210-0 of first clamp circuit 204-0 can set the body bias voltage VBP for some p-channel transistors at p-channel body bias node 210-0. First clamp circuit 204-0 can be controlled by a clamp enable signal (Clamp_EnableP) and a clamp disable signal (Clamp_DisableP). The clamp enable signal (Clamp_EnableP) can be activated from, or correspond to, VDDIO. Thus, an initial ramping of VDDIO can activate Clamp_EnableP. When Clamp_EnableP is active, clamp circuit 204-0 can clamp p-channel body bias node 210-0 to VDD. In contrast, the clamp disable signal (Clamp_DisableP) can be activated by clamp control circuit 214. When activated, signal Clamp_DisableP will override signal Clamp_EnableP, resulting in p-channel body bias node 210-0 being connected to VBP_Gen.

In a similar fashion to first clamp circuit 204-0, second clamp circuit 204-1 can receive VSS from a low power supply input 208-2, receive VBN_Gen from NBB generator circuit 202-1, and can set the body bias voltage VBN for some n-channel transistors at n-channel body bias node 210-1. Second clamp circuit 204-1 can operate in the same fashion as first clamp circuit 204-0. N-channel body bias node 210-1 can be clamped to VSS by operation of a VDDIO-based clamp enable signal (Clamp_EnableN). Such clamping can be disabled in response to a clamp disable signal (Clamp_DisableN), provided from clamp control circuit 214, resulting in n-channel body bias node 210-1 being connected to receive VBN_Gen.

Clamp control circuit 214 can operate according to VDD. That is, once VDD has reached a desired level, or some time afterward, clamp control circuit can activate the clamp disable signals (Clamp_DisableP, Clamp_DisableN).

Figure 2B:
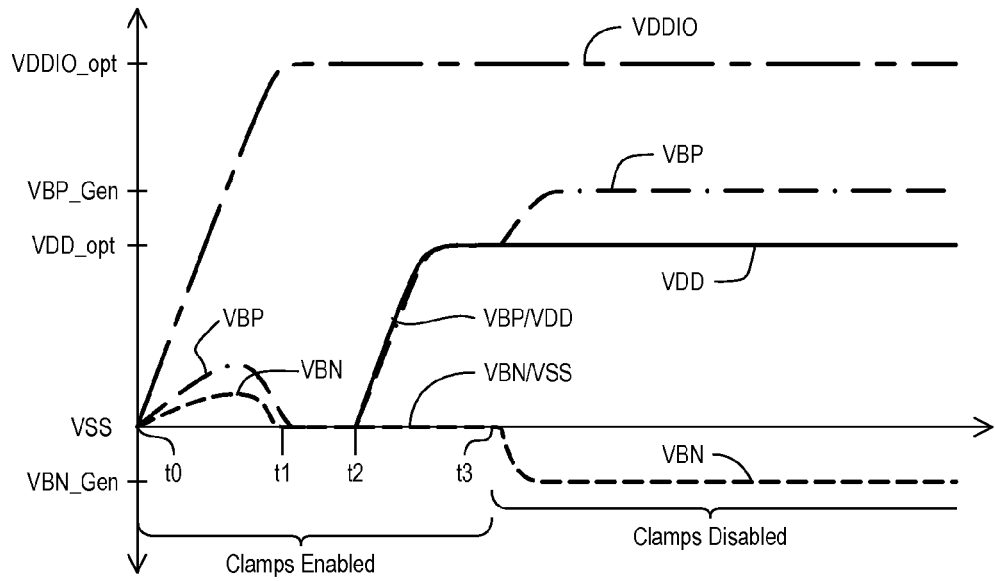
FIG. 2B is a timing diagram showing a power up operation for a circuit like that of FIG. 2A.

One particular power up operation for the body bias circuit of FIG. 2A will be described with reference to FIG. 2B. FIG. 2B is a timing diagram showing VDDIO, VDD, VBP, VBN and VSS, described above.

Referring to FIGS. 2A and 2B, at time t0, VDDIO can ramp up. Due to resistive/capacitive coupling, there may be some variation in VBN/VBP.

At about time t1, VDDIO reaches a level that enables clamp circuits 204-0/1. As a result, VBP is clamped to VDD and VBN is clamped to VSS (which is zero volts in the embodiment shown).

At about time t2, VDD can ramp up. Due to clamping circuits 204-0/1 being enabled, VBP can remain clamped to VDD. Thus, VBP rises with VDD, preventing any forward biasing of p-channel body p-n junctions and/or potential latch-up conditions. Similarly, VBN remains clamped to VSS, also preventing the forward biasing of n-channel body junctions and/or reducing latch-up conditions. Once VDD reaches a sufficient level, body bias circuits (e.g., 202-0/1) can be activated, generating VBP and VBN voltages.

At about time t3, VDD reaches a desired level for a predetermined amount of time. As a result, clamp control circuit 214 can activate clamp disable signals, resulting in clamp circuits 204-0/1 connecting, or passively enabling the connection of, VBP to VBP_Gen and connecting, or passively enabling the connection of, VBN to VBN_Gen. The IC can now operate with transistors having the desired body bias voltage.

While FIG. 2B shows transistors operating with reverse body bias voltages (with respect to VDD_opt and VSS levels), it is understood that body bias voltages have any suitable value for a given application. Further, once established, body bias voltages can be varied in dynamic fashion. Body bias voltages (VBP, VBN) can have the relationships and/or ranges as described for particular embodiments herein, and equivalents.

Generating body bias voltages (e.g., VBP, VBN) with VDD as opposed to VDDIO, as shown in embodiments herein, can be more efficient that conventional approaches. As noted above in connection with FIGS. 13A and 13B, generating a VBN of −0.6 V with a VDDIO of 2.5 V would have a maximum efficiency of 24%. However, if VDD is 0.9 V, generating the same VBN can be performed with a maximum efficiency of 67%, a significant improvement in efficiency.

Figure 3A:
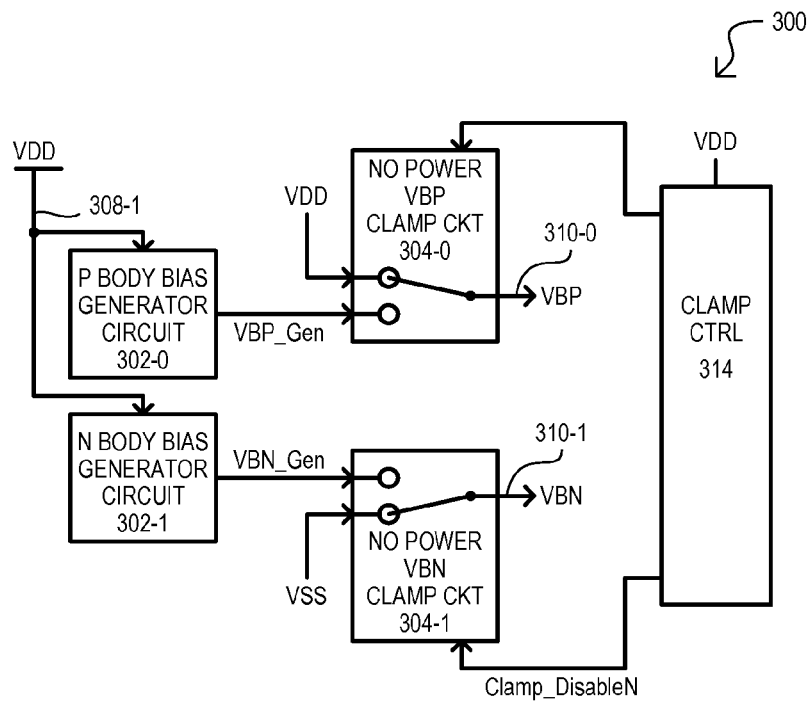
FIG. 3A is a block schematic diagram of a body bias circuit according to another embodiment.

FIG. 3A is a block schematic diagram of a body bias circuit 300 according to another embodiment. In the embodiment shown, a body bias circuit 300 can include clamping circuits that operate in the absence of applied power, or otherwise without the need for a stable power supply. Using such "zero bias" clamping circuits, upon power up, transistor bodies can be clamped to power supply voltages (e.g., VDD, VSS). Once the power supply voltages are stable, body bias generator circuits can generate body bias voltages. The body bias nodes can then be "unclamped" from the power supply voltages and connected to the body bias voltages.

A body bias circuit 300 can include items like those of FIG. 2A, including a PBB generator circuit 302-0, an NBB generator circuit 302-1, a first clamp circuit 304-0, a second clamp circuit 304-1, and a clamp control circuit 314. PBB and NBB generator circuits (302-0/1) can operate like those of FIG. 2A, generating body bias voltages VBP_Gen for p-channel transistors and VBN_Gen for n-channel transistors once a first power supply voltage VDD is stable. Similarly, clamp control circuit 314 can activate the clamp disable signals (Clamp_DisableP, Clamp_DisableN) once VDD has reached a desired level, or some time afterward.

However, unlike the embodiment of FIG. 2A, clamp circuits 304-0/1 do not operate in response to a second power supply VDDIO. Rather, as noted above, in the absence of a VDD, or a stable VDD level, first clamp circuit 304-0 can clamp p-channel body bias node 310-0 to VDD, while second clamp circuit 304-1 can clamp n-channel body bias node 310-1 to VSS. In response to clamp disable signal Clamp_DisableP, first clamp circuit 304-0 can enable p-channel body bias node 310-0 to be connected to the body bias voltage VBP_Gen, generated by PBB generator circuit 302-0. Similarly, in response to clamp disable signal Clamp_DisableN, second clamp circuit 304-1 can enable n-channel body bias node 310-1 to be connected to the body bias voltage VBN_Gen, generated by NBB generator circuit 302-1.

In very particular embodiments, clamp circuits 304-0/1 can utilize depletion mode MOS type transistors. Thus, in the absence of a gate voltage, such transistors can provide a clamping connection (i.e., the source-drain path connects VBN to VSS and/or VBP to VDD). Subsequently, a gate voltage can turn such depletion mode transistors off, enabling the VBN to be connected to VBN_Gen and VBP to be connected to VBP_Gen.

Figure 3B:
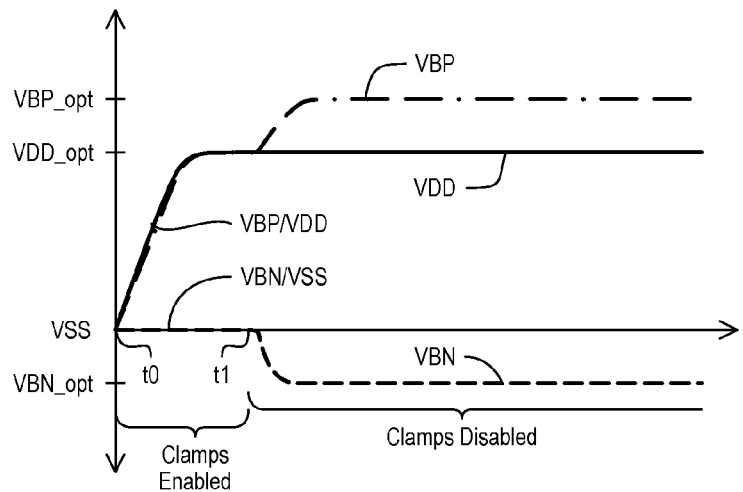
FIG. 3B is a timing diagram showing a power up operation for a circuit like that of FIG. 3A.

One particular power up operation for the body bias circuit of FIG. 3A will be described with reference to FIG. 3B. FIG. 3B is a timing diagram showing VDD, VBP, VBN and VSS, described above.

Referring to FIGS. 3A and 3B, at time t0, VDD can start to ramp up. In a conventional device, such an operation can result in body bias levels (VBP and VBN) varying due to capacitive/resistive coupling. However, by operation of "zero bias" first and second clamp circuits (304-0/1), VBP (a body bias of p-channel transistors) remains clamped to VDD and VBN (a body bias of n-channel transistors) remains clamped to VSS. Consequently the forward biasing of body based p-n junctions and/or latch-up inducing conditions can be prevented.

At about time t1, VDD reaches a desired level for a predetermined amount of time. As a result, clamp control circuit 314 can activate clamp disable signals, resulting in clamp circuits 304-0/1 connecting VBP to VBP_Gen and VBN to VBN_Gen. The IC can now operate with transistors having the desired body bias voltage.

As in other embodiments herein, body bias voltages (VBN_Gen, VBP_Gen) can be reverse body bias voltage, forward body bias voltages, as well as dynamically switching body bias voltages. In particular embodiments, a power supply voltage (VDD) and body bias voltages (VBP, VBN) can have the relationships and/or ranges as described for particular embodiments herein, and equivalents.

Figure 4A:
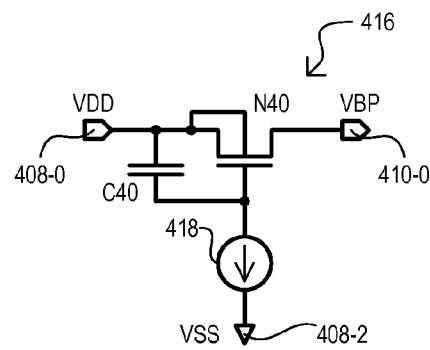
FIG. 4A is a schematic diagram of a clamping device that can be included in embodiments.

FIG. 4A is a schematic diagram of a clamp device 416 according to an embodiment. A clamp device 416 can include a depletion mode n-channel MOS type transistor N40, a capacitance C40, and current source circuit 418. Transistor N40 can have a source connected to a first power supply (VDD) input 408-0, a drain connected to a p-channel body bias node 410-0, and a gate connected to current source circuit 418. A body of transistor N40 can be connected to its source (VDD) (or alternatively to a low power supply voltage (VSS)). Capacitance C40 can be connected between the source and gate of transistor N40.

Current source circuit 418 can be connected between a gate of transistor N40 and a lower power supply connection 408-2. Current source circuit 418 can operate in response to a VDD level. That is, initially, when VDD is ramping up, current source circuit 418 may not draw current. However, once VDD reaches a predetermined level, or is stable for a predetermined amount of time, current source circuit 418 can draw current.

In operation, upon power up, VDD can start to ramp to a desired level. At this time, current source circuit 418 can be disabled. By operation of capacitance C40, a voltage at the gate of N40 can track its source (i.e., track VDD). Because N40 is a depletion mode device, it is conductive in this state, and p-channel body bias node 410-0 (i.e., VBP) can be clamped to VDD.

Subsequently, once VDD is at a suitable level, or stable for a suitable amount of time, current source circuit 418 can be enabled. As a result, the gate of N40 can be pulled toward VSS, turning off N40. In this way, p-channel body bias node 410-0 can be released from being clamped to VDD, and driven to body bias voltage, such as that generated by a body bias generator circuit (e.g., VBP_Gen).

Figure 4B:
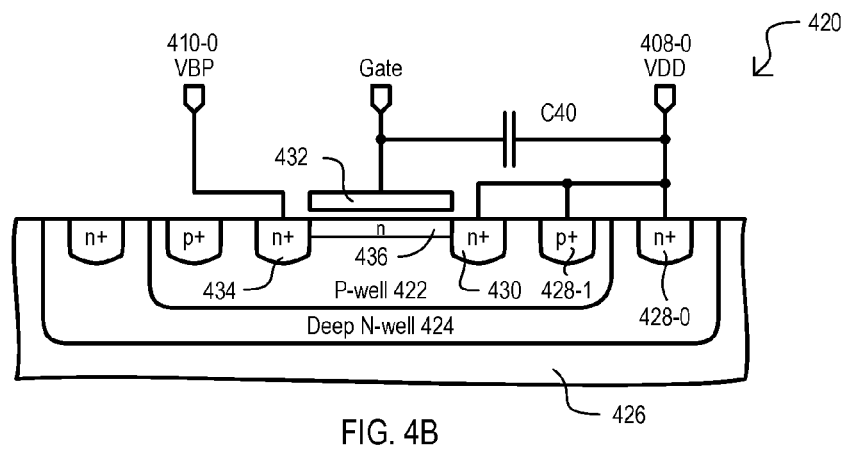
FIG. 4B is a side cross sectional view of a clamping transistor that can be included in the device of FIG. 4A.

FIG. 4B is a side cross sectional representation of a clamping transistor 420, such as that shown as N40 in FIG. 4A. Clamping transistor 420 can be formed in a p-type well (p-well) 422 that is formed in a deep n-type well (n-well) 424, which is formed in a p-type substrate 426. A first power supply (VDD) input 408-0 can be connected to a deep n-well tap 428-0, a p-well tap 428-1, and a source 430 of clamping transistor 420. Capacitance C40 can be connected between source 430 and gate 432. A drain 434 can be connected to a p-channel body bias node 410-0. In some embodiments, a channel region 436 can be doped with n-type dopants to provide the desired response in a depletion mode.

In particular embodiments, a power supply voltage (VDD) and body bias voltage (VBP) can have the relationship and/or ranges as described for particular embodiments herein, and equivalents.

Figure 5A:
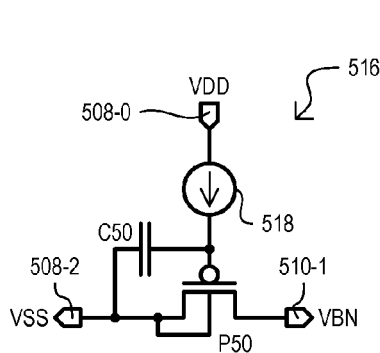
FIG. 5A is a schematic diagram of another clamping device that can be included in embodiments.

FIG. 5A is a schematic diagram of a clamp device 516 according to another embodiment. A clamp device 516 can include a depletion mode p-channel MOS type transistor P50, a capacitance C50, and current source circuit 518. Transistor P50 can have a source connected to a low power supply (VSS) input 508-2, a drain connected to an n-channel body bias node 510-1, a gate connected to current source circuit 518, and a body connected to its source (VSS) (or alternatively to VDD).

Capacitance C50 can be connected between the source and gate of transistor P50. Current source circuit 518 can be connected between a gate of transistor P50 and a high power supply (VDD) connection 508-0. Current source circuit 518 can operate in the same fashion as 418 shown in FIG. 4A.

Clamping device 516 can operate in a manner like that shown in FIG. 4A. In short, as VDD ramps, VBN can be clamped to VSS by depletion mode transistor P50. Once VDD reaches a certain level or is stable for a predetermined amount of time, current source circuit 518 can be enabled, driving the gate of P50 to VDD, thus turning off transistor P50.

Figure 5B:
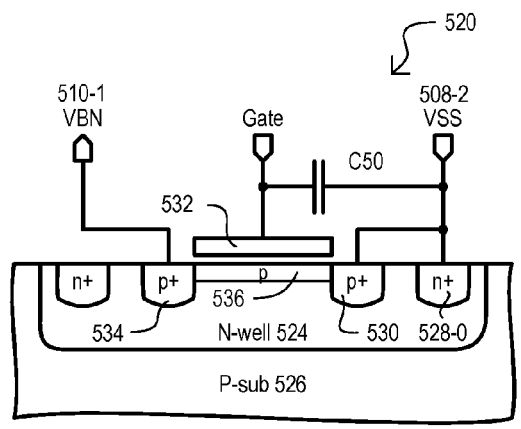
FIG. 5B is a side cross sectional view of a clamping transistor that can be included in the device of FIG. 5A.

FIG. 5B is a side cross sectional representation of a clamping transistor 520, such as that shown as P50 in FIG. 5A. Clamping transistor 520 can be formed in n-well 524, which is formed in a p-type substrate 526. A low power supply (VSS) input 508-2 can be connected to an n-well tap 528-0 and a source 530 of clamping transistor 520. Capacitance C50 can be connected between a source 530 and gate 532 of P50. A drain 534 can be connected to an n-channel body bias node 510-1. In some embodiments, a channel region 536 can be doped with p-type dopants to provide the desired response in a depletion mode.

In particular embodiments, a power supply voltage (VSS) and body bias voltage (VBN) can have the relationship and/or ranges as described for particular embodiments herein, and equivalents.

Figure 6A:
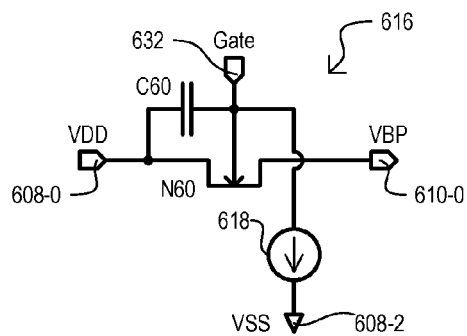
FIG. 6A is a schematic diagram of another clamping device that can be included in embodiments.

FIG. 6A is a schematic diagram of a clamp device 616 according to a further embodiment. A clamp device 616 can include an n-channel junction field effect transistor (JFET) N60, a capacitance C60, and current source circuit 618. JFET N60 can have a source connected to a first power supply (VDD) input 608-0, a drain connected to a p-channel body bias node 610-0, and a gate connected to current source circuit 618.

Capacitance C60 can be connected between the source and gate of transistor N60. Current source circuit 618 can be connected between a gate of transistor N60 and a low power supply (VSS) connection 608-2. Current source circuit 618 can operate in the same fashion as 418 shown in FIG. 4A.

Clamping device 616 can operate in a manner like that shown in FIG. 4A. As VDD ramps, VBP can be clamped to VDD by JFET P60. Once VDD reaches a certain level or is stable for a predetermined amount of time, current source circuit 618 can be enabled, driving the gate of N60 to VSS, turning off transistor N60.

Figure 6B:
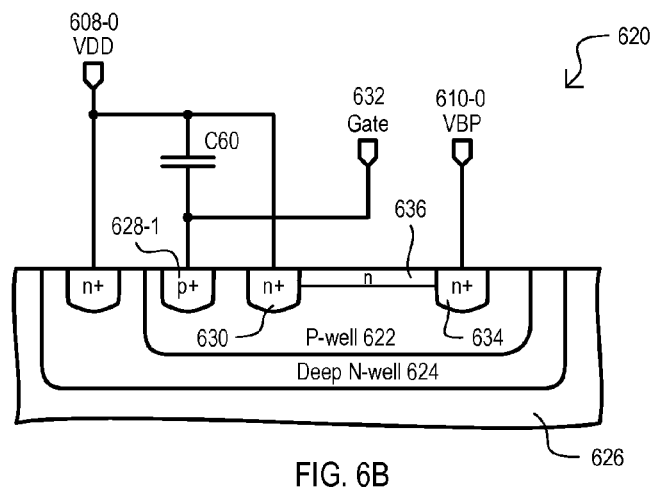
FIG. 6B is a side cross sectional view of a clamping transistor that can be included in the device of FIG. 6A.

FIG. 6B is a side cross sectional representation of a clamping transistor 620, such as that shown as P60 in FIG. 6A. Clamping transistor 620 can be formed in a p-well 622 that is formed in a deep n-well 624, which is formed in a p-type substrate 626. A first power supply (VDD) input 608-0 can be connected to a deep n-well tap 628-0 and a source 630 of clamping transistor 620. A gate 632 can include a p-well tap 628-1 that drives p-well 622. Capacitance C60 can be connected between source 630 and gate 632. A drain 634 can be connected to a p-channel body bias node 610-0. In some embodiments, a channel region 636 can be doped with n-type dopants to provide the desired response.

In particular embodiments, a power supply voltage (VDD) and body bias voltage (VBP) can have the relationship and/or ranges as described for particular embodiments herein, and equivalents.

Figure 7A:
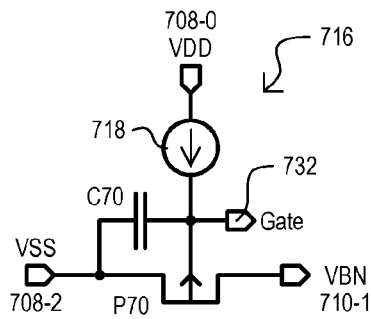
FIG. 7A is a schematic diagram of another clamping device that can be included in embodiments.

FIG. 7A is a schematic diagram of a clamp device 716 according to a further embodiment. A clamp device 716 can include a p-channel JFET P70, a capacitance C70, and current source circuit 718. JFET P70 can have a source connected to a low power supply (VSS) input 708-2, a drain connected to an n-channel body bias node 710-1, and a gate connected to current source circuit 718.

Capacitance C70 can be connected between the source and gate of JFET P70. Current source circuit 718 can be connected between a gate of JFET P70 and a high power supply (VDD) connection 708-0. Current source circuit 718 can operate in the same fashion as 418 shown in FIG. 4A.

Clamping device 716 can operate in a manner like that shown in FIG. 4A. As VDD ramps, VBN can be clamped to VSS by JFET P70. Once VDD reaches a certain level, or is stable for a predetermined amount of time, current source circuit 718 can be enabled, driving the gate of P70 to VDD, turning off JFET P70.

Figure 7B:
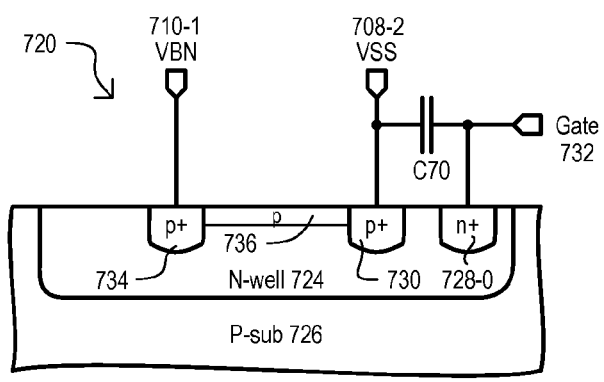
FIG. 7B is a side cross sectional view of a clamping transistor that can be included in the device of FIG. 7A.

FIG. 7B is a side cross sectional representation of a clamping transistor 720, such as that shown as P70 in FIG. 7A. Clamping transistor 720 can be formed in an n-well 724, which is formed in a p-type substrate 726. A low power supply (VSS) input 708-2 can be connected to a source 730 of clamping transistor 720. A gate 732 can include an n-well tap 728-0 that drives n-well 724. Capacitance C70 can be connected between source 730 and gate 732. A drain 734 can be connected to an n-channel body bias node 710-1. In some embodiments, a channel region 736 can be doped with p-type dopants to provide the desired response.

In particular embodiments, a power supply voltage (VSS) and body bias voltage (VBN) can have the relationship and/or ranges as described for particular embodiments herein, and equivalents.

It is understood that the clamp devices and transistors shown in FIGS. 4A to 7B present but a few possible examples of circuits and devices that can be included in embodiments.

Figure 8:
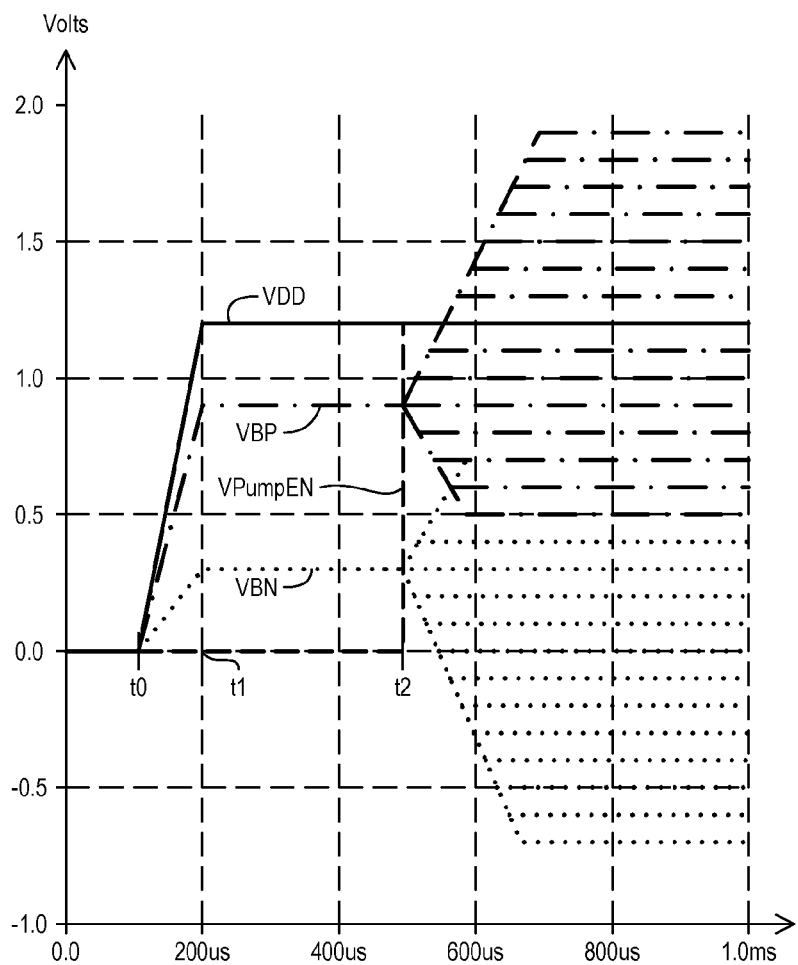
FIG. 8 is a diagram showing simulation results for a power up operation of a conventional integrated circuit (IC) device.

FIG. 8 is a graph showing simulation results of a typical power up operation. FIG. 8 includes waveforms for a power supply voltage VDD that ramps up upon power up, a p-channel body bias voltage VBP, an n-channel body bias voltage VBN, and a signal VPumpEN, which indicates the activation of body bias voltage generating circuits (e.g., charge pumps).

At time t0, VDD starts to ramp from 0 volts to 1.2 volts. Due to capacitive and resistive coupling VBP and VBN rise with VDD. Such a response can result in the forward biasing of p-n junctions and/or latch-up conditions.

At about time t1, VDD reaches a desired level of 1.2 V. VPB and VBN remain at elevated levels.

At about time t2, VPumpEN goes to an active level (high in this example). VBN and VBP can then be driven to desired body bias levels (various examples of possible body bias voltages are shown in FIG. 8).

Figure 9:
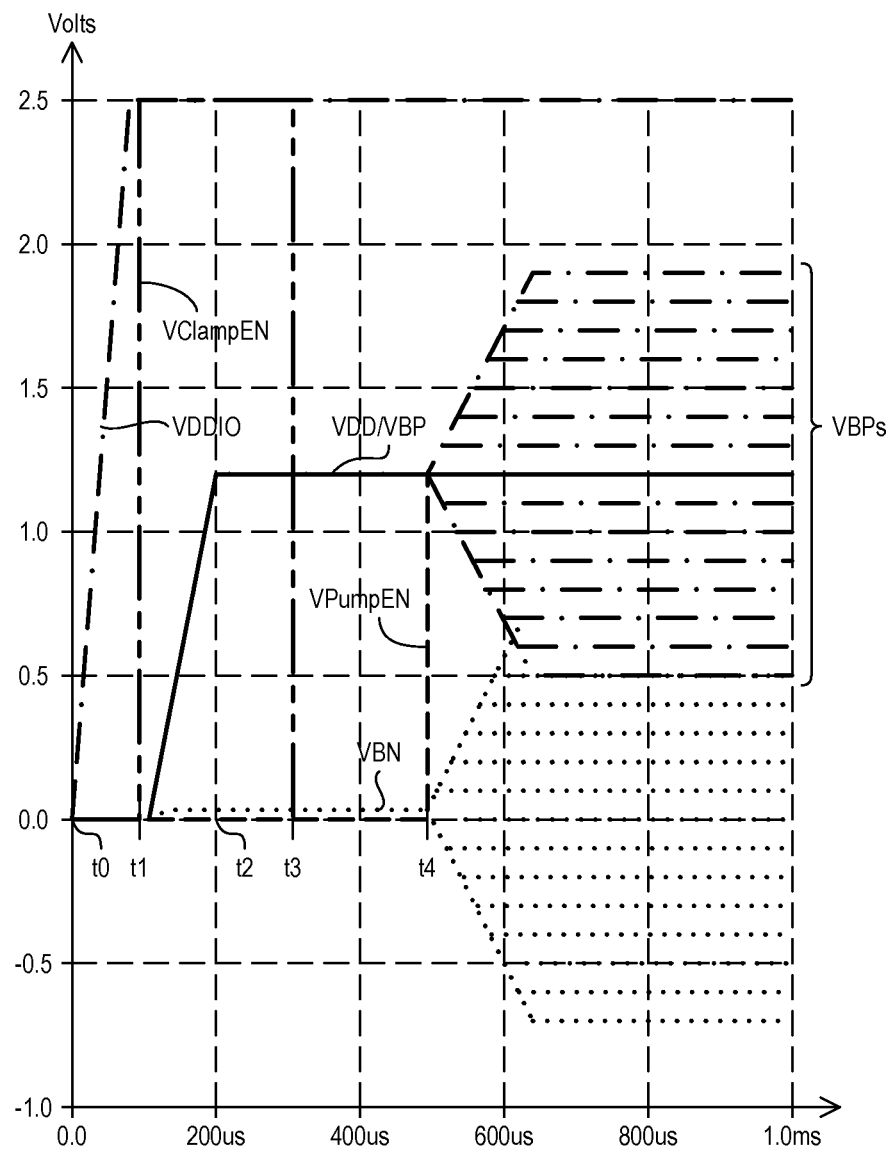
FIG. 9 is a diagram showing simulation results for a power up operation of an IC device according to an embodiment.

FIG. 9 is a graph showing simulation results of a power up operation according to an embodiment. FIG. 9 includes waveforms like those of FIG. 8, including VDD, VBP, VBN and VPumpEN. In addition, FIG. 9 includes waveforms for a second power supply voltage VDDIO and a clamp enable signal VClampEN. VDDIO, is greater than VDD and ramps up prior to VDD. In response to an active (high in this example) VClampEN signal, VBP can be clamped to VDD and VBN can be clamped to VSS, as described herein, or equivalents.

At time t0, VDDIO starts to ramp from 0 volts to 2.5 volts.

At time t1, after VDDIO reached 2.5 volts, VClampEN can be activated. As a result, VBP is clamped to VDD and VBN is clamped to VSS. After time t1, VDD can start to ramp from 0 volts to 1.2 volts. However, unlike FIG. 8, due to the clamping operations, VBP tracks VDD and VBN closely tracks VSS. Accordingly, the forward body biasing of body based p-n junctions and latch-up conditions can be prevented.

At time t2, VDD reaches its target value of 1.2 volts.

At time t3, after VDD has reached a stable value, VClampEN can return to an inactive level. Thus, VBP and VBN are released from being clamped to VDD and VSS, respectively.

At time t4, VPumpEN can be active, resulting in VBP and VBN being driven to desired body bias voltages.

Figure 10:
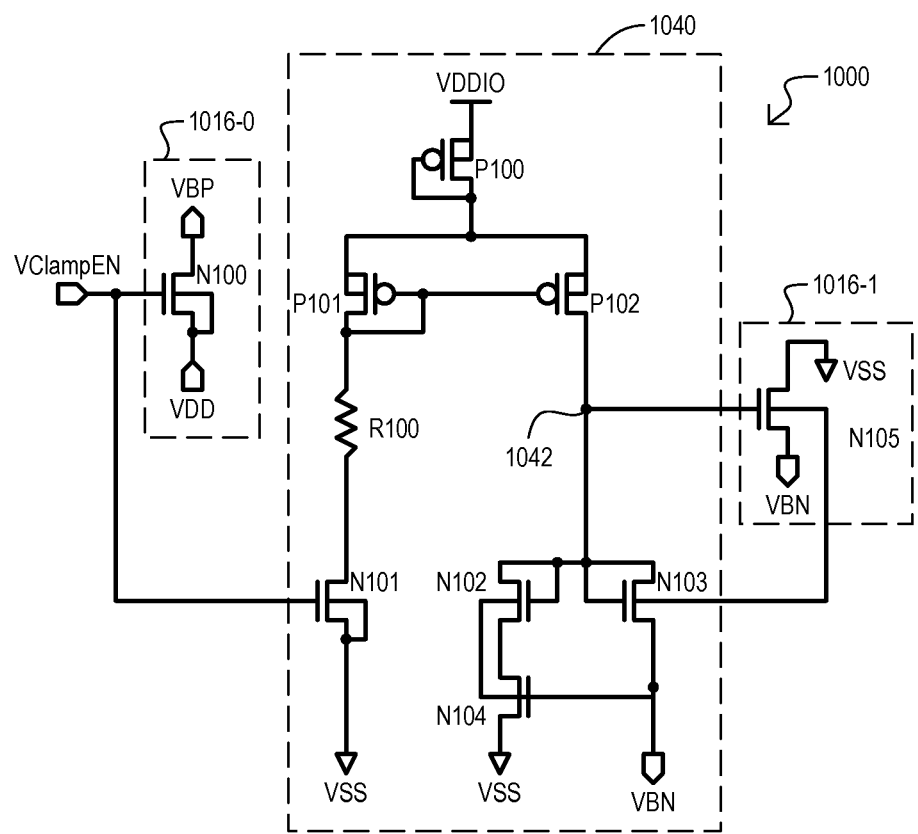
FIG. 10 is a schematic diagram of a clamping circuit according to an embodiment.

FIG. 10 is a schematic diagram of a clamping circuit 1000 according to one particular embodiment. In the embodiment of FIG. 10, in response to a clamp enable signal (VClampEN) being active, clamping circuit 1000 can clamp a p-channel body bias node (VBP) to a high power supply voltage (VDD) and an n-channel body bias node (VBN) to a low power supply voltage (VSS). In response to a clamp enable signal (VClampEN) being inactive, a clamping circuit 1000 can isolate VBP from VDD and isolate VBN from VSS.

In the particular embodiment shown, a clamping circuit 1000 includes a first clamping device 1016-0, a second clamping device 1016-1, and a control section 1040. A first clamping device 1016-0 can include an n-channel MOS type transistor N100 having a source and body connected to VDD, a drain connected to VBP, and a gate connected to receive VClampEN.

A control section 1040 can include a current mirror circuit formed by p-channel transistors P100/P101/P102, a resistor R100, and an n-channel MOS type transistor N101. Transistor P100 can have a source connected to a second power supply voltage VDDIO and a gate and drain connected to one another. VDDIO can ramp up before, and be greater than, VDD. Transistors P101/P102 can form a current mirror, having sources commonly connected to the gate-drain of P100. Transistor P101 can have its gate connected to its drain. Transistor P102 can have a gate connected to the gate of P101 and a drain connected to a control node 1042. Resistor R100 can be connected between the gate-drain of transistor P101 and the drain of transistor N101. Transistor N101 can have a gate that receives VClampEN and a body and source connected to VSS.

A control section 1040 can also include a disable circuit formed by n-channel MOS type transistors N102/N103/N104. Transistors N102 and N103 can have drains and gates commonly connected to control node 1042. Transistor N102 can have a source connected to the drain of transistor N104. Transistor N103 can have a source connected to n-channel body bias node VBN. The bodies of transistors N102/N104 can be commonly connected to each other. Transistor N104 can have a source connected to VSS.

A second clamping device 1016-1 can include an n-channel MOS type transistor N105 having a drain connected to VSS, a source connected to VBN, and a body connected to the body of N103.

In operation, VDDIO can ramp to a high level, enabling control section 1040.

Subsequently, VClampEN can be activated (e.g., driven to VDDIO). As a result, first clamping device 1016-0 can clamp VBP to VDD. In addition, VClampEN can turn on transistor N101, pulling one leg of the current mirror low. This results in control node 1042 being driven high. As a result, second clamping device 1016-1 can be turned on, clamping VBN to VSS.

VDD can then be ramped up, with VBP and VBN now clamped to VDD and VSS, respectively.

When VClampEN returns to an inactive level (e.g., VSS), first clamping device 1016-0 can turn off, isolating VBP from VDD. This can allow VBP to be driven to a desired body bias voltage. In addition, transistor N101 within the current mirror circuit turns off. As a result, control node 1042 can fall, turning off second clamping device 1016-1 to isolate VBN from VSS. This can allow VBN to be driven to a desired body bias level. Disable circuit N102/N103/N104 can ensure second clamping device 1016-1 remains turned off, even when VBN is driven below VSS.

While embodiments can be included in IC devices having conventional MOS type transistors, in some embodiments, all or a portion of the transistors within the integrated circuit device can be "deeply depleted channel" (DDC) transistors having an enhanced body effect as compared to conventional transistors. Accordingly, body bias voltages applied to DDC transistors can be used to modulate transistor responses more effectively than conventional MOS type transistors.

In some embodiments, transistors with driven body bias voltages can be DDC transistors. That is, bodies of DDC transistors can be clamped upon power-up as described herein, or equivalents. In addition or alternatively, the transistors making up body bias circuits can be DDC transistors.

Thus, it is understood that any of the MOS type transistors described in the embodiments herein can be DDC transistors.

Figure 11A:
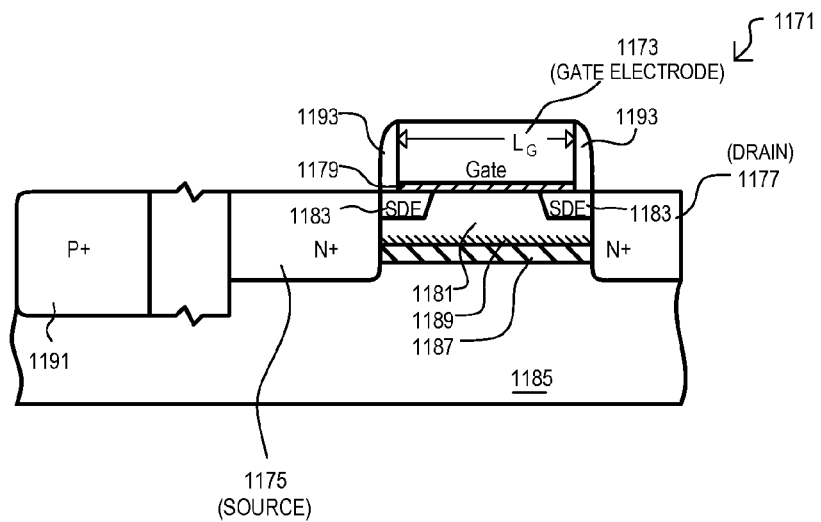
FIGS. 11A to 11C are side cross sectional views of deeply depleted channel (DDC) transistors that can be included in embodiments.

FIG. 11A shows a DDC type transistor 1171 that can be included in embodiments herein. A DDC transistor 1171 can be configured to have an enhanced body coefficient, along with the ability to set a threshold voltage (Vt) with enhanced precision. A DDC transistor 1171 can include a gate electrode 1173, source 1175, drain 1177, and a gate dielectric 1179 positioned over a substantially undoped channel 1181. Optional lightly doped source and drain extensions (SDE) 1183 can be positioned respectively adjacent to source 1175 and drain 1177. Such extensions 1183 can extend toward each other, reducing effective length of the substantially undoped channel 1181. In the embodiment shown, insulating sidewalls 1193 can be formed on sides of gate electrode 1173.

In FIG. 11A, DDC transistor 1171 is shown as an n-channel transistor having a source 1175 and drain 1177 made of n-type dopant material, formed upon a substrate such as a p-type doped silicon substrate, which can be a p-well 1185. A body bias voltage VBN can be applied via a tap 1191 to the p-well 1185. However, a p-channel DDC transistors would be understood from FIG. 11A (i.e., would have reverse doping types).

In some embodiments, a DDC transistor 1171, a highly doped screening region 1187 and optional threshold voltage set region 1189 can be made with dopants of the same conductivity type as the body (i.e., p-type dopant material in FIG. 11A). In certain embodiments, a screening region 1187 can have a dopant concentration between about $5 \times 10^{18}$ to $1 \times 10^{20}$ dopant atoms/cm$^3$, with the selected dopant concentration dependent on the desired threshold voltage as well as other desired transistor characteristics. In some embodiments, a substantially undoped channel region 1181 can have a depth that ranges from approximately 5-25 nm, with the selected thickness based upon the desired threshold voltage for the transistor.

Further descriptions of a DDC transistor as well as an exemplary fabrication process and other aspects of a DDC transistor can be found in U.S. Pat. No. 8,273,617, titled "Electronic Devices and Systems, and Methods for Making and Using the Same."

Figure 11B:
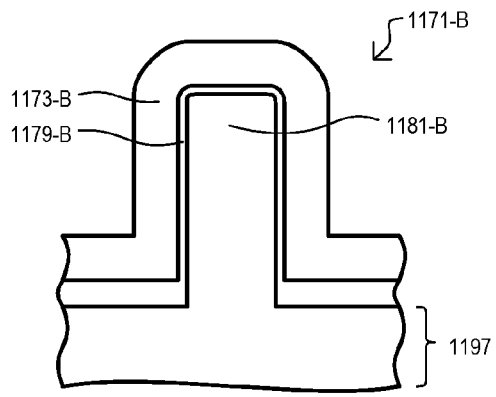

FIG. 11B shows a FinFET type transistor 1171-B that can receive a body bias voltage according to embodiments. FinFET transistor 1171-B can include a gate electrode 1173-B and gate dielectric 1179-B that surrounds a substantially undoped channel 1181-B on opposing sides. The view of FIG. 11B is taken along a channel length. Thus, it is understood that source and drain regions can extend into and out of the view shown. A body bias VBB can be applied via a connection to a substrate 1197.

Figure 11C:
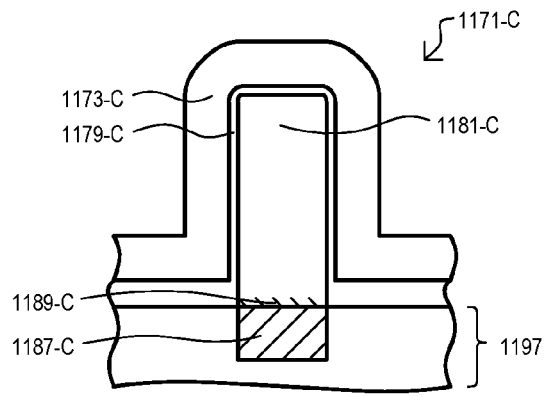

FIG. 11C shows a FinFET type transistor 1171-C having a screening region 1187-C, that can receive a body bias voltage according to embodiments. As in the case of FIG. 11A, the FinFET transistor 1171-C has a highly doped region that can be configured to have an enhanced body coefficient, along with the ability to set a Vt with enhanced precision. The transistor 1171-C includes a gate electrode 1173-C and gate dielectric 1179-C formed over a substantially undoped channel 1181-C on opposing sides. However, unlike FIG. 11B, a highly doped screening region 1187-C can be formed in a substrate 1197 below substantially undoped channel 1181-C rising upward three-dimensionally. Optionally, a Vt set region 1189-C can be formed between the screening region 1187-C and substantially undoped channel 1181-C.

As in the case of FIG. 11B, the view of FIG. 11C is taken along a channel length, and source and drain regions can extend into and out of the view, separated from screening region 1187-C by portions of substantially undoped channel region 1181-C. A body bias VBB can be applied via a connection to a substrate 1197. Further descriptions of a FinFET transistor having a highly doped region can be found in patent application International Application No. PCT/US12/49531 titled "Semiconductor Devices Having Fin Structures and Fabrication Methods Thereof".

It should be appreciated that in the foregoing descriptions of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the invention.

It is also understood that the embodiments may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit (IC) device, comprising:
at least a first body bias circuit that receives a first power supply voltage, the first body bias circuit configured to generate a first body bias voltage different from the first power supply voltages of the IC device;
at least a clamp control circuit that receives the first power supply voltage and generates a clamp signal when the clamp control circuit detects a saturation of the first power supply voltage;
at least a first bias control circuit that receives the first power supply voltage, the first body bias voltage and the clamp signal, the first bias control circuit configured to set a first body bias node to the first power supply voltage while the first power supply voltage is developing and until the first power supply voltage has completed developing, and to subsequently enable the first body bias node to be set to the first body bias voltage according to the clamp signal after the first power supply voltage reaches stable level and is saturated; and
a plurality of first transistors having bodies connected to the first body bias node.

2. The IC device of claim 1, wherein:
the first bias control circuit includes a depletion mode transistor having a source-drain path coupled between the first power supply voltage and the first body bias node.

3. The IC device of claim 1, further including:
a second body bias circuit that receives the first power supply voltage, the second body bias circuit configured to generate a second body bias voltage different from the first power supply voltages of the IC device and the first body bias voltage;
a second bias control circuit that receives a second power supply voltage, the second body bias voltage and the clamp signal, the second bias control circuit configured to set a second body bias node to the second power supply voltage while the first power supply voltage is developing, and subsequently set the second body bias node to the second body bias voltage according to the clamp signal after the first power supply voltage reaches stable level and is saturated; and
a plurality of second transistors having bodies connected to the second body bias node.

4. The IC device of claim 3, wherein:
the first transistors are n-channel transistors and the second transistors are p-channel transistors.

5. The IC device of claim 1, wherein:
the IC device receives a first high power supply voltage, a second high power supply voltage greater than the first high power supply voltage, and a low power supply voltage;
the first bias control circuit is powered from the second high power supply voltage, and configured to set the first body bias node to the first power supply voltage in response to the second high power supply voltage, and set the first body bias node to the first body bias voltage in response to the first high power supply voltage reaching a predetermined level.

6. The IC device of claim 5, wherein:
the first high power supply voltage is less than 1.5 volts and the second power supply voltage is greater than 1.5 volts.

7. The IC device of claim 1, wherein:
the first bias control circuit includes a clamping transistor having a source-drain path coupled between the first power supply voltage and the first body bias node, and a gate control circuit configured to enable the clamping transistor while the first body bias circuit is developing the first body bias voltage, and disable the clamping transistor when the first body bias voltage is established; wherein
the clamping transistor is selected from the group of an insulated gate field effect transistor and a junction field effect transistor.

8. The IC device of claim 1, further including:
at least a portion of the first transistors comprise deeply depleted channel (DDC) transistors, each DDC transistor having a screening region formed below a substantially undoped channel, the screening region including a dopant concentration of no less than $1 \times 10^{18}$ dopant atoms/cm$^3$ with dopants of a conductivity type opposite to that of a source and drain of the DDC transistor.

9. A method, comprising:
applying a first power supply voltage to an integrated circuit device;
initially clamping at least a first body bias node to the first power supply voltage while the first power supply voltage is developing and until the first power supply voltage has completed developing;
generating at least a first body bias voltage with the first power supply voltage; and
subsequently allowing the first body bias node to be driven by the first body bias voltage after detecting a saturation of the first power supply voltage; wherein
the first body bias node provides the first body bias voltage to bodies of a plurality of first transistors.

10. The method of claim 9, wherein:
prior to generating the first body bias voltage with the first power supply voltage,
generating a clamp enable signal with a third power supply voltage greater than the first power supply voltage; wherein
the first body bias node is clamped to the first power supply voltage in response to the clamp enable signal.

11. The method of claim 9, further including:
initially clamping a second body bias node to a second power supply voltage while the first power supply voltage is developing;
generating a second body bias voltage with the first power supply voltage; and
subsequently allowing the second body bias node to be driven with the second body bias voltage after detecting a saturation of the first power supply voltage; wherein
the second body bias node provides the second body bias voltage to bodies of a plurality of second transistors.

12. The method of claim 11, wherein:
the first body bias voltage is a reverse body bias voltage selected from the group of: a reverse p-channel body bias voltage (VBP) that is greater than the first power supply voltage, and a reverse n-channel body bias voltage (VBN) that is less than the second power supply voltage.

13. The method of claim 12, wherein:
the reverse VBP ranges from 0.1 volts to 1.0 volts more than the first power supply voltage, and the reverse VBP ranges from 0.1 volts to 1.0 volts less than the second power supply voltage.

14. The method of claim 9, wherein:
at least a portion of the first transistors comprise deeply depleted channel (DDC) transistors, each DDC transistor having a screening region formed below a substantially undoped channel, the screening region including a dopant concentration of no less than $1\times10^{18}$ dopant atoms/cm$^3$ and with dopants of conductivity type opposite to that of a source and drain of the DDC transistor.

15. An integrated circuit (IC) device, comprising:
a first power supply connection configured to receive a first power supply voltage;
a second power supply connection configured to receive a body bias voltage based on a second power supply voltage greater than the first power supply voltage;
at least a first body bias generator circuit coupled to receive power at a generator power supply node and configured to generate a first body bias voltage;
a switch circuit configured to couple the second power supply connection to the generator power supply node while the first power supply voltage is developing and until the first power supply voltage has completed developing, and to subsequently couple the first power supply connection to the generator power supply node after detecting a saturation of the first power supply voltage; and
a plurality of first transistors having bodies coupled to receive the first body bias voltage.

16. The IC device of 15, further including:
a voltage regulator configured to receive the second power supply voltage and regulate the second power supply voltage to achieve the body bias voltage.

17. The IC device of claim 15, wherein:
at least a portion of the first transistors comprise deeply depleted channel (DDC) transistors, each DDC transistor having a screening region formed below a substantially undoped channel, the screening region including a dopant concentration of no less than $1\times10^{18}$ dopant atoms/cm$^3$ with dopants of a conductivity type opposite to that of a source and drain of the DDC transistor.

18. The IC device of claim 1, wherein:
the first bias control circuit is configured to receive a third power supply voltage and to set the first body bias node to the first power supply voltage or the first body bias voltage according to the third power supply voltage, the third power supply voltage ramps up and is established prior to ramping-up of the first power supply voltage.

19. The IC device of claim 15, wherein:
the second power supply voltage rumps up and is established prior to ramping-up of the first power supply voltage.

* * * * *